(12) United States Patent
Kleveland

(10) Patent No.: US 7,482,888 B1
(45) Date of Patent: Jan. 27, 2009

(54) FAST STARTUP RESONANT ELEMENT OSCILLATOR

(75) Inventor: Bendik Kleveland, Santa Clara, CA (US)

(73) Assignee: ZeroG Wireless, Inc., Sunnyvale, CA (US)

(*) Notice: Subject to any disclaimer, the term of this patent is extended or adjusted under 35 U.S.C. 154(b) by 82 days.

(21) Appl. No.: 11/827,947

(22) Filed: Jul. 12, 2007

(51) Int. Cl.
*G01R 23/00* (2006.01)
*H03B 5/06* (2006.01)
*H03L 7/24* (2006.01)

(52) U.S. Cl. .................... 331/173; 331/44; 331/47; 331/48; 331/74

(58) Field of Classification Search .......... 331/14, 331/18, 25, 44, 46–48, 50, 52, 54, 55, 74, 331/145, 149, 153, 154, 158, 159, 172, 173, 331/175, 176, 177 R, 177 V, 179
See application file for complete search history.

(56) References Cited

U.S. PATENT DOCUMENTS

| | | | |
|---|---|---|---|
| 3,743,960 A * | 7/1973 | Steudel | 331/1 A |
| 4,704,587 A | 11/1987 | Ouyang et al. | |
| 4,956,618 A | 9/1990 | Ulmer | |
| 5,155,453 A | 10/1992 | Ruetz | |
| 5,805,027 A | 9/1998 | Yin | |
| 5,877,840 A | 3/1999 | Yamada et al. | |
| 6,057,742 A | 5/2000 | Prado | |
| 6,646,514 B2 | 11/2003 | Sutliff et al. | |
| 6,791,424 B2 | 9/2004 | Uchiyama et al. | |
| 6,803,833 B2 | 10/2004 | Yen et al. | |
| 6,819,195 B1 | 11/2004 | Blanchard et al. | |
| 6,954,113 B2 | 10/2005 | Fallisgaard et al. | |
| 7,009,458 B2 * | 3/2006 | Gazit | 331/116 R |

OTHER PUBLICATIONS

AMIS-5200 Register Description for Transceiver IC, www.amis.com, 12 pages total, © 2003 AMI Semiconductor, Inc.
Dallas Semiconductor MAXIM, Mar. 25, 2003, Application Note 1955 Fast Start-up Oscillator (FOX) BOOSTS Superhet Performance, 5 pages total, AN1955, AN 1955, APP1955, APPNOTE1955 © 2005 by Maxim Integrated Products.

* cited by examiner

*Primary Examiner*—David Mis
(74) *Attorney, Agent, or Firm*—The Mueller Law Office, P.C.

(57) ABSTRACT

A startup circuit 200 and method 700 is provided for quickly starting up a resonator based oscillator. Tunable oscillator 201 provides an impetus signal to oscillator 205 through capacitor 202. The impetus signal has a frequency that is an estimate of the resonant frequency of resonator 205. The circuit measures the frequency of oscillator 204 and the frequency of tunable oscillator 201. The circuit then adjusts the frequency of tunable oscillator 201 such that the frequency of the tunable oscillator is substantially equal to the resonant frequency of the resonator 205 and stores a data state necessary for the tunable oscillator 201 to generate a signal with this target frequency in the future. During an ensuing startup cycle the stored data state causes the impetus signal delivered by tunable oscillator 202 to be substantially equal to the target frequency of oscillator 204 which improves startup performance.

20 Claims, 7 Drawing Sheets

Prior Art Oscillator Circuit 100

Oscillator Circuit 200

Precision Oscillator 300

Piezoelectric Oscillators 400

Colpitts Oscillator 401	Inverter Oscillator (Prior Art) 410

Performance Data 500

Transient Simulation Results 600

Method Flow Chart 700

FAST STARTUP RESONANT ELEMENT OSCILLATOR

FIELD OF THE INVENTION

The invention relates generally to electronic oscillator circuits, and more specifically to decreasing the startup time of oscillators using an impetus signal targeted at the resonant frequency of the oscillator.

BACKGROUND OF THE INVENTION

The prevalence of wireless electronic devices has placed increasing constraint on the power performance of electronic circuits. The convenience and utility of battery powered wireless devices are greatly improved through the use of low power circuits. Circuit techniques that preserve power are, therefore, increasingly important in order for these devices to keep in step with higher consumer expectations for convenience and device functionality.

A common method of preserving power in electronic circuits involves placing the circuit into different phases of variant levels of power consumption and functionality. Such techniques may preserve power due to the inverse relationship of functionality and power consumption in electronic circuits. For example, a relay transmitter will wake up and transmit information in its regular operating state after receiving a stimulus, but will then return to a low power state while waiting for further instructions.

The time it takes for a circuit to transfer from a low power, low functionality state to a high power, operational state is referred to as the startup time. Modern circuits may make such transitions several times in a single millisecond. While the circuit is in transition, it is not operational, but it is still consuming more power than it does in its dormant state. In the interest of decreasing power consumption and improving performance, it is best to keep the transition time as short as possible. This is a second order form of power performance improvement that was marginalized in the recent past. Startup circuits were usually focused on reliability while speed was a secondary concern. With the tighter power constraints of wireless electronics, fast startup circuits have become increasingly valuable.

A clocking circuit comprises one of the base levels of functionality for a digital electronic circuit. A common form of clocking circuit utilizes a resonant element, such as a piezoelectric resonator or resonant micro-electromechanical system (MEMS) element, to set the frequency of the clock. The frequencies at which such resonators oscillate are referred to as the resonant frequencies. Each resonant element has its own resonant frequencies that are based on certain parameters such as the material and geometry of the element. During operation of the clocking circuit, a particular resonant frequency is selected and utilized depending upon the desired clock frequency. The resonant element is coupled to feedback circuitry that provides it with energy at the desired resonant frequency to maintain oscillation. Before the resonator begins to oscillate the feedback system is rudderless and has nothing to feedback to the resonator. Therefore, the resonator and accompanying feedback circuit must receive energy from an external source in order for oscillation to commence.

It is generally known that a crystal oscillator starts up when it is provided with energy from an external source. The energy from an external source places the crystal in a nonzero energy state from which the oscillator state evolves. The most efficient stimulus has a frequency equal to the resonant frequency as energy at other frequencies will be rejected by the oscillator. The initial solution for this problem was to configure the circuit so that is was sensitive to thermal noise during startup. Thermal noise is low energy white noise and is always present in circuits. White noise is random and covers all frequencies. Therefore, the crystal would receive energy across a wide bandwidth as well as at its resonant frequency without the circuit designer having to determine and target the resonant frequency. Circuits that applied this method involved placing the circuit into two different states. During startup the circuit would be placed in a first state that would allow a large amount of noise in the circuit. This high level of noise would decrease the startup time. After startup the circuit would transfer into a low noise state for proper operation.

Related support circuits were focused on determining when oscillation had begun so that the circuit could be switched into its operating state at the soonest possible time. These circuits would therefore act to minimize the startup time. The main drawback of these circuits is that power would be wasted since white noise has just as much energy at the target frequency as it does at other spurious frequencies. The low power of thermal noise also limited the energy delivered to the resonator which increased the required startup time.

Another technique involves leaving the crystal in oscillation during shutdown and avoiding the need to start it up again altogether. An example of this technique can be found in U.S. Pat. No. 5,155,453. Circuits utilizing this method report impressive startup times of 0.25 milliseconds. However, this technique is not fairly comparable to full shutdown techniques because power consumption in the shutdown state is necessarily higher for circuits that maintain oscillation.

As power consumption has fallen under greater scrutiny, more complex circuits have been developed that generate specific impetus signals rather than relying on random noise. A single pulse impetus signal is presented in U.S. Pat. No. 5,805,027 by Yin. Performance figures were reported in the range of 100 milliseconds. Another similar technique described in U.S. Pat. No. 6,057,742 by Prado involved the use of a noise pulse impetus signal. This method has the benefit of roughly targeting the specific resonant frequency of the crystal while not interrupting the bias point of the circuit as would occur from a single large step pulse.

Recent circuits have begun to more actively target the impetus signal that will produce optimal startup. In a circuit developed by Gazit in U.S. Pat. No. 7,009,458 a train of pulses is provided to the piezoelectric resonator by a second oscillator with a short start up time. A problem that arises with impetus signals of this form is that the circuit needs to shut them off soon after oscillations are triggered. If the impetus signal is not disconnected the circuit may suffer from resonator overdrive. Resonator overdrive is similar to the effect that an extremely large push has on a rope swing. If one pushes on an empty swing as hard as they can the ropes will go slack and the swing will not continue swinging.

The method proposed by Gazit does not deal with targeting the specific resonant frequency of the piezoelectric oscillator. The method instead focuses on the optimal number of pulses provided to the resonator before problems with resonator overdrive occur. This circuit requires a counter circuit to be active during startup to measure the number of pulses delivered to the resonator. This adds to the circuit's power consumption during startup. In addition, the optimal number of pulses will depend on the particular resonator on a device to device basis and will not likely provide enough resolution to trigger the optimal startup time for any given resonator.

Another circuit that uses a multiple pulse impetus signal is that developed by Blanchard in U.S. Pat. No. 6,819,195. The impetus signal in this circuit is targeted at and is calibrated to the resonant frequency of the resonator. Calibration is accomplished by tuning the bias current of a ring oscillator. Control circuitry controls the time for which such a signal is applied so that oscillations begin under all operating conditions. The main oscillator is coupled to the impetus oscillator through two transconductance amplifiers that provide AC current to the two terminals of a differential oscillator.

The Blanchard circuit shares the problem addressed by the Prado circuit. Since the impetus signal is DC coupled to the oscillator the bias points of the oscillator circuit will be severely affected during the startup phase. Once the impetus signal is removed, there will be an added transient period required while the circuit adjusts to the correct DC operating point. This increases the overall startup time. The Blanchard circuit also suffers from the drawback of resonator overdrive in that the impetus signal is DC coupled to the main oscillator terminals. This drawback necessitates the use of complex control and monitor circuitry that turns off the impetus signal at a particular time. The Blanchard circuit is also differential which necessitates the use of two buffers. Since buffers are generally the most power hungry devices in an oscillator circuit, the power consumption of the circuit during startup is not optimal.

The susceptibility of prior art to resonator overdrive and self cancelling is revealed by the simplified circuit diagram shown in FIG. 1. The AC current source buffers 102 deliver the impetus signal to piezoelectric oscillator 104. Oscillator 104 is known as an inverter oscillator and is composed of piezoelectric resonator 106, two capacitors 105 and 111, resistor 107 and inverting amplifier 109. Buffer 110 delivers the output oscillation signal of piezoelectric oscillator 104 to compare and control circuitry 103. The piezoelectric oscillator feedback circuit is driven by amplifier 109. The impetus signal and the piezoelectric oscillator's output signal are DC coupled and drive the same nodes in the circuit. Therefore, if the tunable oscillator contains spurious frequencies, such signals are applied by powerful buffers that directly conflict with the piezoelectric oscillator.

Sensitivity to overdrive and self cancelling requires the use of complex monitor and control circuitry that assures the impetus signal generator is deactivated after a stable operational point has been reached. The prior art managed this requirement through the use of a counter circuit in digital circuitry 103 that counted the number of pulses provided by tunable oscillator 101 to piezoelectric oscillator 104. After a certain number of pulses were delivered to the piezoelectric oscillator the AC current source buffers 102 would be disabled by the compare and control circuitry 103. The added complexity of this circuit affects reliability. In addition, the added circuitry increases the cost and power consumption of the circuit.

The circuit's method of driving the oscillator has the additional drawback of affecting the DC bias points. In some oscillators the nodes that are driven by the impetus signals will need to be biased at specific DC values during operation. When enabled, AC current source buffers 102 will be driving these nodes to values that are far from their DC bias. It will take additional time after the impetus signal is disabled for the circuit to adjust from the driven bias point to the correct operating state DC bias point. The distance these points drift will be random, and a circuit designer will have to wait for the worst case time period before operating the circuit. This is an undesirable condition since power will be wasted while the circuit is settling.

SUMMARY OF INVENTION

In one aspect of the invention, an oscillator with an improved startup circuit is provided. A main oscillator based around a resonator element generates an output frequency which is substantially equal to the resonant frequency of the resonator during stable operating conditions. A tunable oscillator is AC coupled to the main oscillator and provides an impetus signal to the main oscillator. The AC coupling is accomplished through the use of a capacitor coupled to the main oscillator and to the tunable oscillator. Through the use of this capacitor, the tunable oscillator applies energy to the resonator at its resonant frequency while having minimal effect on the main oscillator once the main oscillator has reached its stable operating state. Compare and control circuitry, including digital logic and frequency detectors, is coupled to the tunable oscillator and the main oscillator. The compare and control circuitry can disable the impetus signal and can enable the main oscillator and the tunable oscillator. The compare and control circuitry also measures and compares the frequency of the output signals of the two oscillators and can adjust the tunable frequency so as to be substantially equal to the resonant frequency of the resonator. In addition, the compare and control circuitry can target the particular resonant frequency of the resonator in cases where the circuit utilizes more than one of a particular resonator's multiple resonant frequencies.

In another aspect of the invention, a method for quickly starting up an oscillator is provided. First, an impetus signal is generated and applied to the oscillator. The impetus signal is then disabled after a set amount of time. The circuit may then wait a further amount of time for the oscillator to reach a regular operating state. The frequency of the oscillator is then measured which provides an accurate measurement of the resonant frequency of the resonator. The frequency of a tunable oscillator is then calibrated so that it outputs a signal with a frequency substantially equal to the measured resonant frequency of the resonator. The circuit then stores a data state which will set the tunable oscillator into its calibrated state. The circuit can store different data states corresponding to different resonant frequencies in cases where multiple resonant frequencies are targeted in different cycles. On an ensuing startup cycle the stored data state is applied to the tunable oscillator and the tunable oscillator provides its output to the main oscillator as an impetus signal. The ultimate result of this method is that the impetus signal delivered to the resonator through AC coupling is substantially equal to the resonant frequency which provides for rapid startup.

DETAILED DESCRIPTION OF THE PREFERRED EMBODIMENTS

Reference now will be made in detail to embodiments of the disclosed invention, one or more examples of which are illustrated in the accompanying drawings. Each example is provided by way of explanation of the present technology, not as a limitation of the present technology. In fact, it will be apparent to those skilled in the art that modifications and variations can be made in the present technology without departing from the spirit and scope thereof. For instance, features illustrated or described as part of one embodiment may be used on another embodiment to yield a still further embodiment. Thus, it is intended that the present subject matter covers such modifications and variations as come within the scope of the appended claims and their equivalents.

A need exists for a resonator based oscillator with a fast and reliable startup. The startup circuit should be independent of operating condition variations such as process and temperature. The impetus signal for oscillation should be targeted to the resonant frequency of the resonator. The impetus signal should also not affect the bias conditions of the oscillator to minimize the lag time of the associated transients. The circuit should also be configured to reduce problems associated with resonator overdrive and self-cancellation. In addition, startup circuit complexity should be kept to a minimum to limit power consumption.

Figure 1:
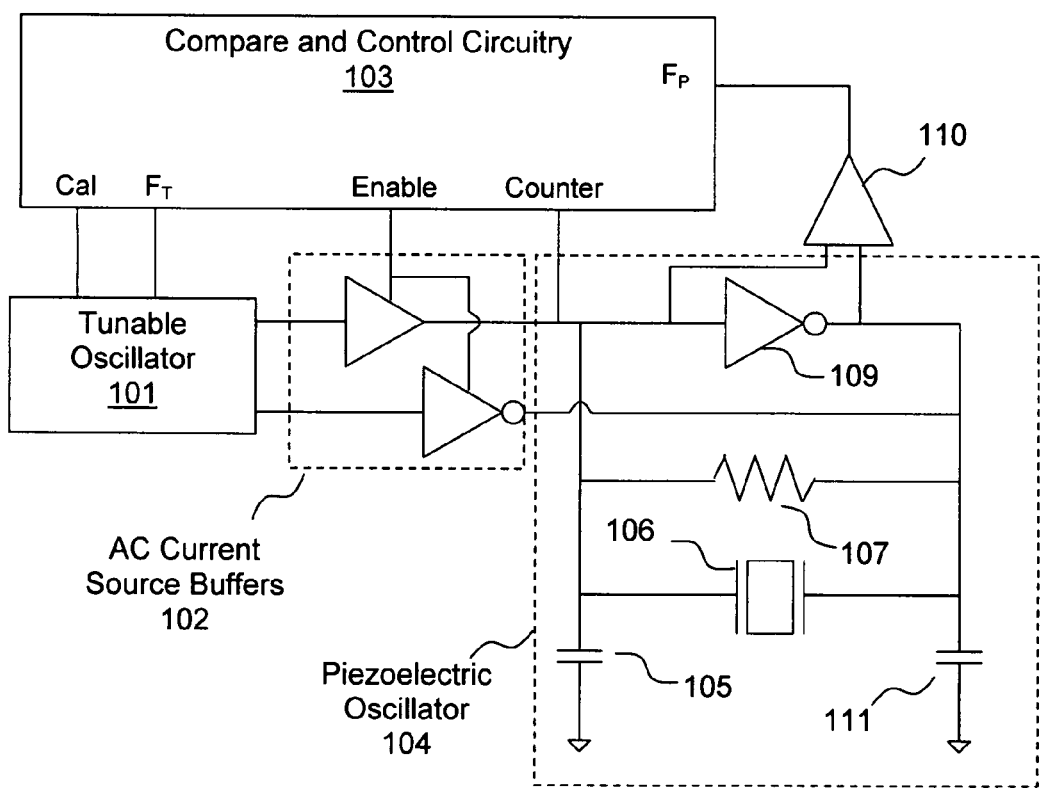
FIG. 1 illustrates a prior art fast startup oscillator circuit.
Figure 2:
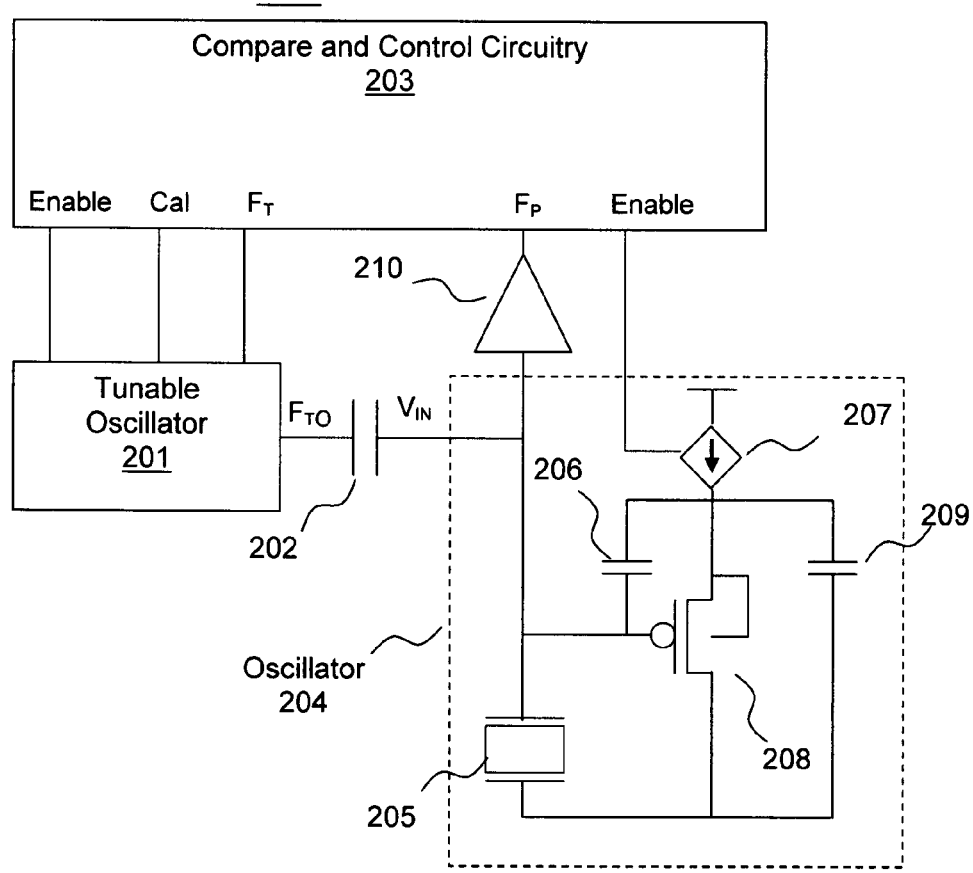
FIG. 2 illustrates an exemplary embodiment of a fast startup oscillator circuit consistent with the present invention.

The circuit of FIG. 2 is a simplified diagram of a preferred embodiment of the present invention. Although the invention will work with a differential oscillator, oscillator circuit 200 uses a single ended oscillator 204 in accordance with a particular embodiment. In oscillator circuit 200, tunable oscillator 201 is AC coupled to resonator 205 by capacitor 202. Oscillator 204 is comprised of resonator 205 and support circuitry comprised of capacitors 206 and 209, current source 207, and PMOS transistor 208. Oscillator 204 produces a frequency equal to the resonant frequency of resonator 205 at node $V_{in}$. Compare and Control circuitry 203 is capable of enabling and disabling both tunable oscillator 201 and piezoelectric oscillator 205. Compare and Control circuitry 203 is also capable of measuring and comparing the frequency of oscillators 201 and 204. Finally, compare and control circuitry 203 is capable of delivering a calibration code to tunable oscillator 201.

Tunable oscillator 201 provides an impetus signal at node $F_{TO}$ in the form of an AC electronic signal. The frequency of the impetus signal that will provide the fastest startup is the resonant frequency of resonator 205. During regular operation, the output frequency of oscillator 204 is substantially equal to the resonant frequency of resonator 205.

On a first startup cycle, compare and control circuitry 203 provides a calibration code to tunable oscillator 201 which produces an impetus signal at node $F_{TO}$. On this first cycle the calibration code will produce a best guess of the resonator's resonant frequency. Once the oscillator circuit reaches regular operating condition compare and control circuitry 203 will receive the output frequency of oscillator 204 at node $F_P$ through buffer 210. The compare and control circuitry may deactivate the AC coupling from tunable oscillator 201 to resonator 205 while the frequency of the tunable oscillator and resonant element oscillator are being measured. During operation the latter frequency is the resonant frequency of resonator 205. Therefore the compare and control circuitry 203 will be able to find and store the calibration code required to make the frequency of tunable oscillator 201 at node $F_{TO}$ equal to the resonant frequency of resonator 205.

The next time the circuit starts up, the stored calibration code will be delivered to tunable oscillator 201. Tunable oscillator 201 will then produce an impetus signal at node $F_{TO}$ that is AC coupled to the input terminal of the resonator. This will result in an optimal startup time as the resonator will be provided with an impetus signal having a frequency substantially equal to its resonant frequency.

The design's emphasis on the accuracy of tunable oscillator 201 and the AC coupling of the impetus signal to the resonator element oscillator through capacitor 202 solve the major problems identified in the prior art. Since the impetus signal is delivered through AC coupling, the DC bias points of oscillator 204 are not altered by the startup circuit. Therefore, there are no large transient voltage swings associated with disabling tunable oscillator 201.

The circuit's approach also decreases sensitivity to resonator overdrive and self canceling. The circuit's focus on accuracy as the critical element allows for the use of minimal AC coupling and requires less energy from the impetus signal. Therefore, the impetus signal will deliver less energy at spurious frequencies that would cancel the crystal's oscillations. In addition, the effect of the impetus signal on the crystal's oscillation once a stable operating point has been reached is mitigated and the circuit is less susceptible to overdrive. Therefore, it is not as critical for the tunable oscillator to be shutoff once oscillations have begun. The ultimate result of this approach is the elimination of the need for complex counter and detection circuitry to determine when the tunable oscillator should be shutoff.

Figure 3:
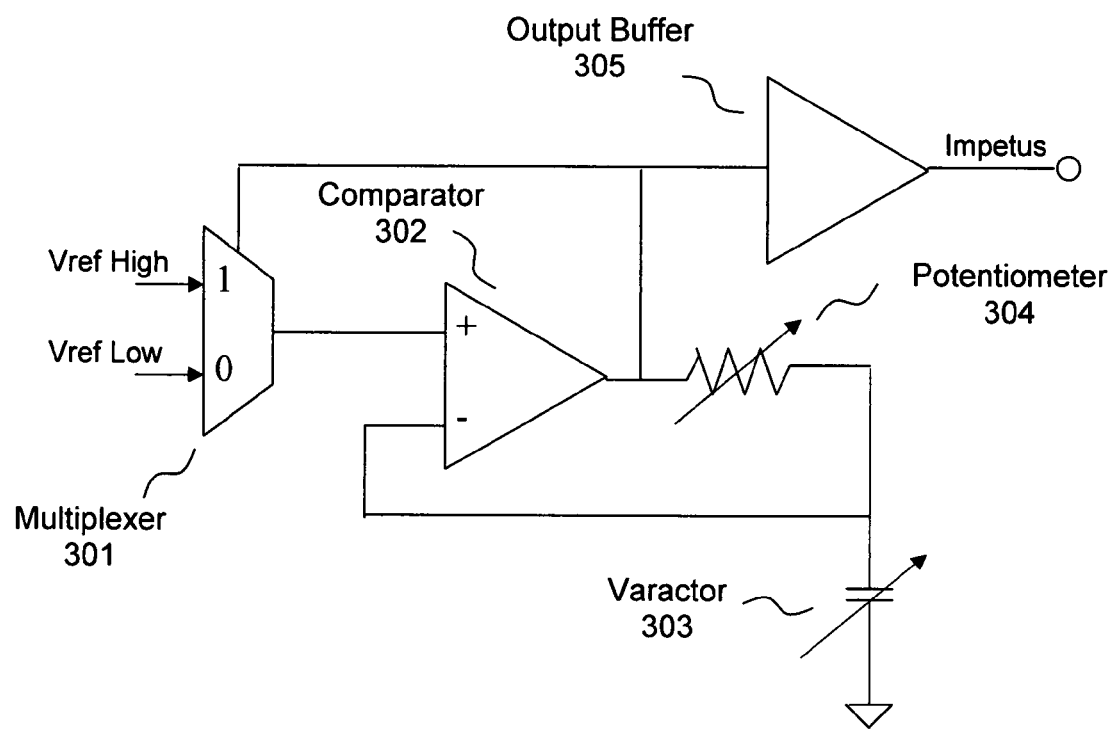
FIG. 3 illustrates an exemplary embodiment of a tunable oscillator used for applying an AC coupled impetus signal to an oscillator.

In an embodiment of the present invention tunable oscillator 201 in FIG. 2 is a precision oscillator similar to circuit 300 in FIG. 3. The impetus signal is provided to coupling capacitor 202 in FIG. 2 by output buffer 305 at the node labeled Impetus. The output buffer may be disabled independently of the rest of precision oscillator 300 so that control circuitry can monitor the tunable oscillator's frequency at the same time it monitors the resonator element oscillator's frequency. By making Vref High and Vref Low functions of the supply voltage the precision oscillator is impervious to noise variations in the system. The frequency of the oscillator is directly controlled by the capacitance of varactor 303 and the resistance of potentiometer 304. Either one or both of the devices need to be variable in order for the devices to be tunable. Comparator 302 and multiplexer 301 form the rest of the feedback loop but do not have any effect on the frequency of the oscillator. Modern processes have resistors and capacitors with very low temperature coefficients. Therefore, the circuit does not need temperature compensation. This is beneficial because the temperature coefficient of a typical resonator such as a crystal is extremely low. In order for the tunable oscillator to accurately target the resonant frequency the tunable oscillator should have a low temperature coefficient as well.

Figure 4:
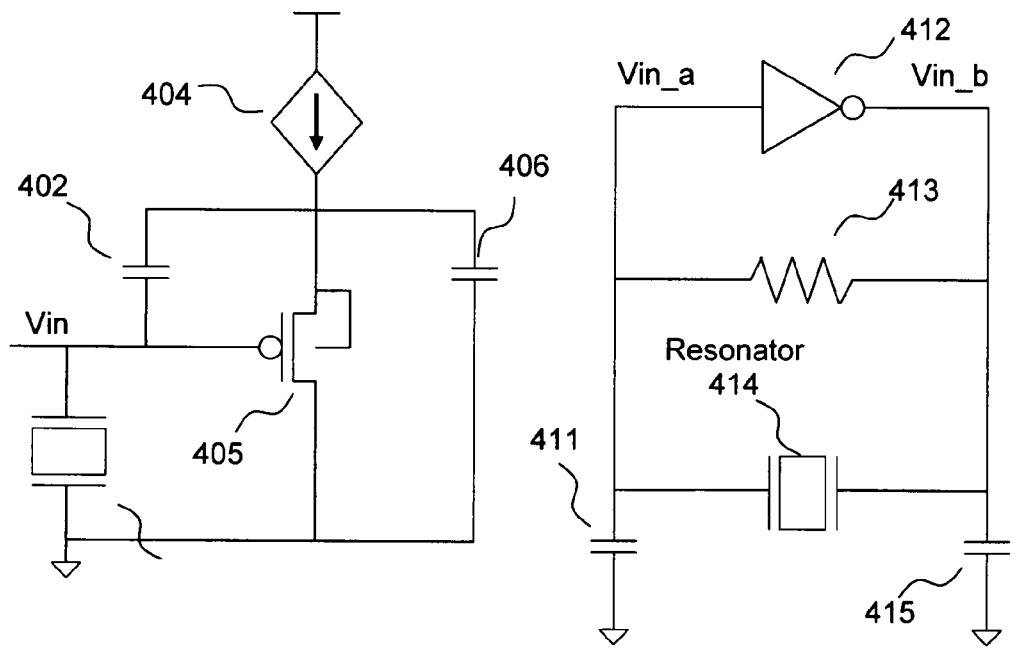
FIG. 4 illustrates a comparison of an exemplary embodiment of an oscillator circuit consistent with the present invention and a less desirable oscillator circuit.

In an embodiment of the present invention the resonator element oscillator is single ended. This embodiment is shown in FIG. 2 and the oscillator is marked 204. In particular, single ended oscillator 204 could be a single ended Colpitts Oscillator similar to 401 in FIG. 4. The advantages of Colpitts Oscillator circuit 401 compared to oscillator 410, or other differential oscillator, is a lower degree of power consumption and relaxed impetus signal requirements. Since 401 is single ended only one buffer is required to drive the resonator at $V_{IN}$ with the impetus signal. In contrast, a differential oscillator such as 410 would require two buffers that would drive nodes Vin_a and Vin_b. Since buffers are relatively high power devices in analog circuits this embodiment results in significant power savings.

The embodiment wherein the resonator element oscillator is a Colpitts oscillator also has the benefit of mitigating the effect of inaccuracies in the impetus signal. Colpitts oscillators such as circuit 401 apply feedback directly in phase with the resonator. When the gate of PMOS transistor 405 is at its maximum value, resonator 403 is at the maximum end of its voltage oscillation. In addition, capacitors 402 and 406 are receiving the maximum amount of current they receive during their oscillation cycle because PMOS transistor 405 is sinking its minimum current during the oscillation cycle. The faster the capacitors 402 and 406 charge, the faster PMOS transistor 405 changes to a high current state. The result is that the feedback circuitry comprised of devices 402, 404, 405, and 406 is pushing back with maximum force when resonator 403 is at the maximum end of its voltage cycle. In contrast, the inverter oscillator of 410 has feedback circuitry comprised of devices 411, 412, 413, and 415 that pushes back with maximum force when resonator 414 is in the middle of its voltage cycle. Pierce oscillators also exhibit this characteristic. The result is that inaccuracies in the impetus signal degrade startup performance to a greater degree in circuit 410 as compared to circuit 401. A simplified analogy to this effect is present in the everyday activity of pushing a child on a swing. The similarity is that it is easier to push the child from the end of the arch rather than in the middle. This specific embodiment is in keeping with the circuit's focus on the accuracy of the impetus signal rather than the total energy delivered.

In another embodiment of the invention resonator element 202 has multiple resonant frequencies. Such an embodiment would be useful in applications where a clock circuit needed to drive a circuit that operated at different frequencies in different phases. In such a situation, oscillator circuit 201 would decrease the startup time for each of the different phases in the same manner. The only requirement placed on the circuit in order to provide this added functionality would be that compare and control circuitry 203 would need to be able to differentiate between the different phases for storage and controlling impetus signal application and calibration.

Figure 5:
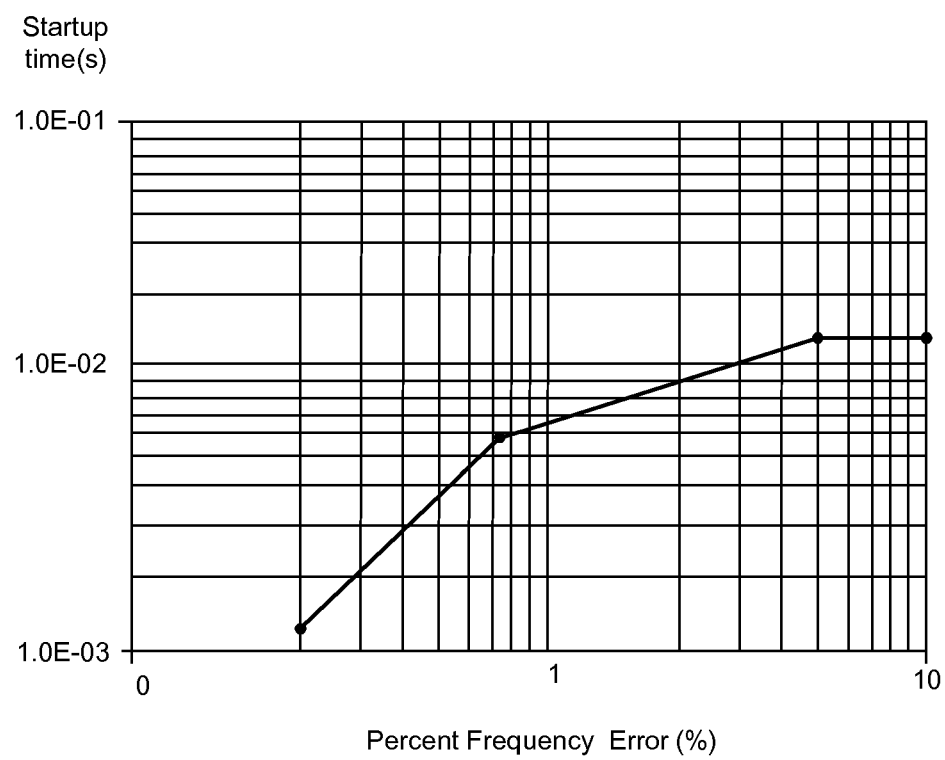
FIG. 5 is a graph of circuit data obtained from testing an embodiment of the current invention.

The circuit displayed in 200 performed well when implemented on Silicon. FIG. 5 displays data obtained from a test chip that implemented an embodiment of the present invention which highlights the advantage of the present invention. The advantaged revealed by the data is that a limited amount of energy needs to be applied to the resonator so long as the energy is well targeted. The x-axis of plot 500 displays the percentage error in the frequency of the impetus signal compared to the target resonant frequency of the resonator. The y-axis of plot 500 displays the startup time in milliseconds. As seen in the plot, increasing the accuracy of the impetus signal provides increasing returns in terms of startup time.

Figure 6:
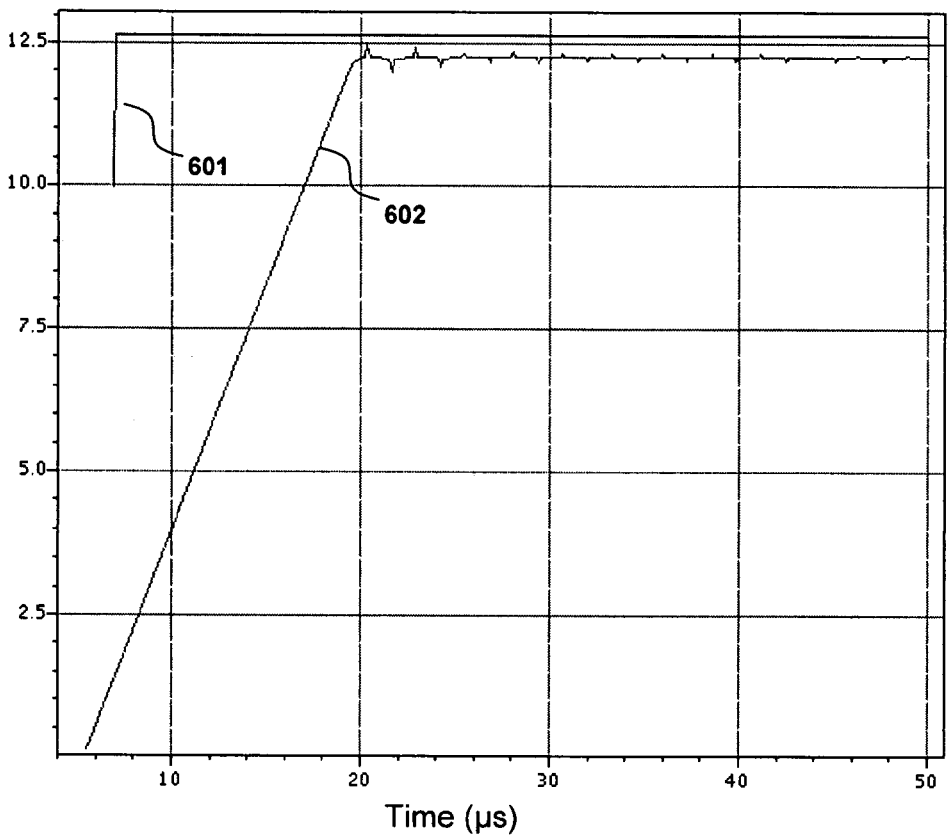
FIG. 6 is a graph of circuit simulation data illustrating the success of minimal AC coupling of the impetus signal.

FIG. 6 is a plot of simulation data displaying a major benefit of an embodiment of the invention. Plot 600 display's the results of a transient simulation of an embodiment of the invention where the impetus signal from the tunable oscillator remained coupled to the main oscillator. The x-axis of plot 600 displays the time elapsed in the simulation in microseconds. The y-axis of plot 600 displays the frequency of the tunable oscillator and the main oscillator in megahertz. The simulation was set so that the impetus signal's frequency was not equivalent to the resonator's frequency. In such a situation the errors related to resonator overdrive and oscillator self-cancellation could plague the system if the impetus signal generator is not shutoff. Such problems would be exemplified in a frequency plot because in such cases the impetus signal dominates and the main oscillator's frequency will lock up with the impetus signal frequency. Plot line 601 is the frequency of the tunable oscillator and plot line 602 is the frequency of the main oscillator. As seen in the graph the frequency of the main oscillator does not lock up with the tunable oscillator even when the tunable oscillator is not disabled. What this plot ultimately shows is that the AC coupling of the impetus signal successfully mitigates the problems of resonator overdrive and oscillator self-cancellation.

Figure 7:
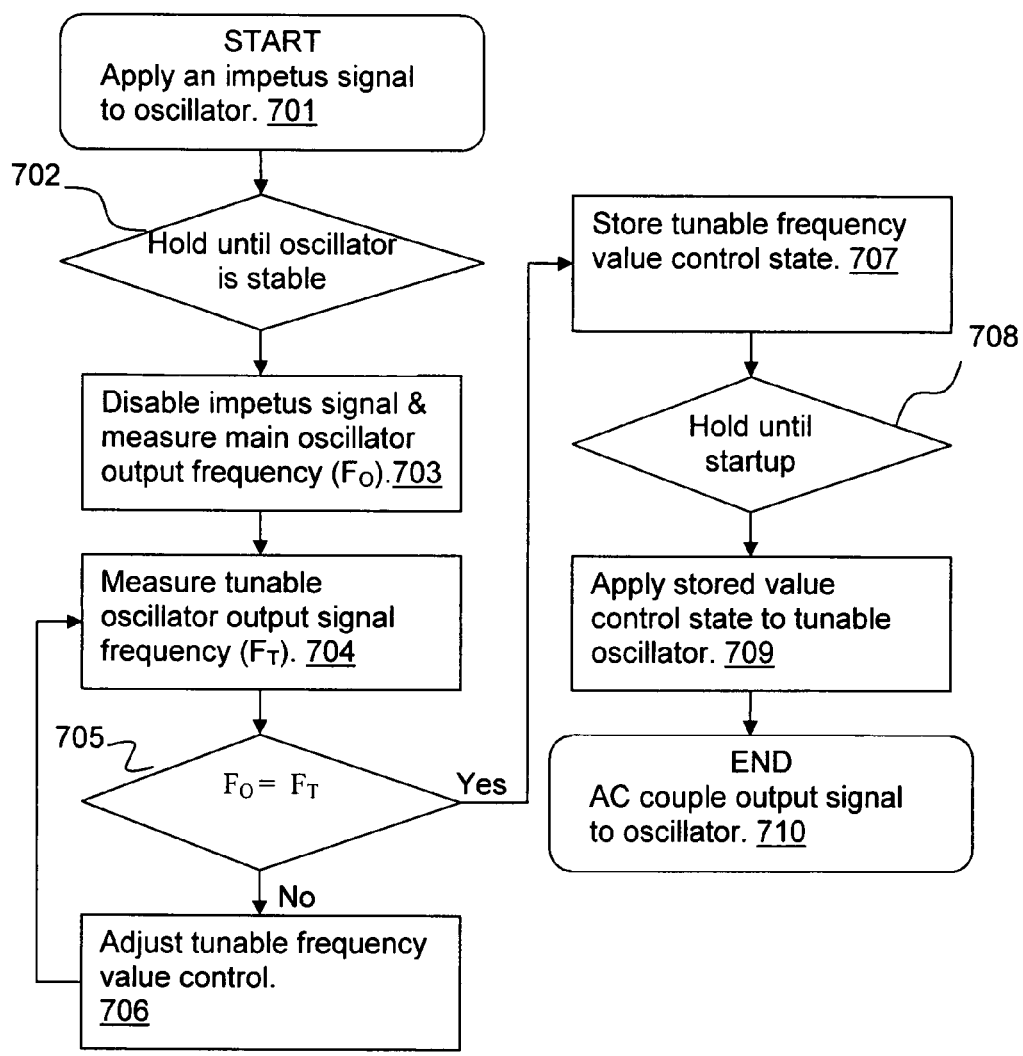
FIG. 7 is a flowchart that illustrates exemplary steps for a method that is consistent with the present invention.

FIG. 7 is a flow chart of process 700 that is in keeping with an application of the present invention. In step 701 an impetus signal is delivered to a resonator based oscillator. The impetus signal may have a frequency that is an estimate of the resonant frequency. For example, an estimate provided by the manufacturer of a crystal resonator. The impetus signal may be generated by the tunable oscillator. In such a case, the impetus signal might also have a frequency determined by stored digital information from a previous run of the measurement and calibration cycle. In step 702 the circuit holds for a set amount of time for the oscillator to reach a regular operating state. The circuit may also hold until circuitry either counts a certain number of pulses from the oscillators in the circuit, or detects when a signal has a selected amplitude. The time that the circuit holds for will depend on the impetus signal delivered during step 701. In step 703 the impetus signal is disabled and the oscillator's output frequency $F_O$ is measured. The impetus signal is deactivated to allow for accurate measurement of the main oscillator frequency. The impetus signal may be disabled by deactivating a buffer that drives the oscillator circuit with the tunable oscillator's output frequency. The benefit of this approach would be that the tunable oscillator would still be running so that it is available immediately for the following step.

The loop formed by 704, 705, and 706 is the frequency tuning loop. Any number of adjustment algorithms can be applied so long as this general form is followed. The circuit will adjust the tuning frequency value state until the state is found for which the tunable oscillator generates a signal with frequency FT equal to the resonator's resonant frequency $F_O$. In step 707 the tuning loop is finished. The tunable frequency value control state that is discovered by the control loop is stored for later use. Step 708 is not controlled by the oscillator circuit. During step 708 the circuit completes its operation, shuts down, holds for a given period, and begins to restart by sending a startup signal to the oscillator circuit. Upon receipt of such a startup signal the oscillator circuit will move on to step 709. In step 709 the stored tunable frequency value control state will be applied to the tunable oscillator. The tunable oscillator will start rapidly and produce the tuned output signal having a frequency equal to the resonant frequency of the resonator. The circuit will then be configured in step 710 such that the tuned output signal is AC coupled to the oscillator.

After the steps of flow chart 700 are executed the startup circuit does not need to take any other actions. This is because problems associated with the impetus signal conflicting with the resonator based oscillator circuit are not present in this invention due to AC coupling. Still, the startup circuit can be designed so that the tunable oscillator shuts down after a set amount of time. This will save power and provide a greater margin of reliability for the oscillator's performance.

The value stored in step 707 can be reused in all subsequent startup cycles. The result is that the circuit can start up utilizing steps 709 and 710 only. If additional accuracy is required the circuit method can begin back at step 701 every time the circuit starts up under a different operating condition. Each time the circuit follows this additional procedure the stored frequency control state will be stored with accompanying information regarding the circuit's operating point. In this case, the impetus signal that is applied in a later cycle will be the output of the tunable oscillator when the frequency value control state is applied whose accompanying stored operating point information most closely matches the current operating point of the circuit. The effect will be that operating point variations in the resonant frequency of the resonator will be corrected for, as the applied impetus signal will match the change in the resonant frequency. The set period held for in 702 will be variable to account for the significant change in the expected startup time that will result from the improved accuracy of the impetus signal.

The compare and control circuitry may also be configured to store different impetus signal value data states depending upon the particular resonant frequency desired. Recalling that a particular resonator may have multiple resonant frequencies the utility of such an approach is quite apparent. The first time a particular resonant frequency is targeted compare and control circuitry would have to apply the steps of flowchart 700 starting at step 701. After the circuit is calibrated for that particular resonant frequency the circuit can skip calibration in all subsequent startup cycles. As for a circuit with only one resonant frequency, the compare and control circuitry can utilize the value stored in 707 that correspond to the impetus signal that matches the desired resonant frequency. The only additionally required control functionality would be that required to select a resonant frequency for the ensuing operational state and correlate the appropriate stored data state.

Although embodiments of the invention have been discussed primarily with respect to specific embodiments thereof, other variations are possible. Various oscillator configurations may be used in place of, or in addition to, the circuit configurations presented herein. Functions may be performed by hardware or software, as desired. Note that steps can also be added to, taken from, or modified from the steps in this specification without deviating from the scope of the invention. In general, any flowcharts or circuit diagrams presented are only intended to indicate one possible configuration or sequence of basic operations to implement a function, and many variations are possible. Those skilled in the art will also appreciate that methods and systems consistent with the present invention are suitable for use in a wide range of applications encompassing any that utilize a clocking system. In particular, there should be no implied assumption from the discussion that the invention only applies to constant amplitude oscillation. The invention will function to excite a resonator into any periodic steady state and such state may not be constant amplitude. While the specification has been described in detail with respect to specific embodiments of the invention, it will be appreciated that those skilled in the art, upon attaining an understanding of the foregoing, may readily conceive of alterations to, variations of, and equivalents to these embodiments. These and other modifications and variations to the present invention may be practiced by those skilled in the art, without departing from the spirit and scope of the present invention, which is more particularly set forth in the appended claims. Furthermore, those skilled in the art will appreciate that the foregoing description is by way of example only, and is not intended to limit the invention.

What is claimed is:

1. An oscillator circuit, comprising:

A main oscillator generating an output frequency, said main oscillator including a resonator having a resonant frequency that is substantially equal to said output frequency while said circuit is operating in a stable condition;

a tunable oscillator being AC coupled to said main oscillator and providing an input signal to said main oscillator, said input signal having a tunable frequency;

a capacitor coupled to said main oscillator and to said tunable oscillator, said capacitor coupling in said input signal to said main oscillator so that said resonator receives energy at said resonant frequency while said input signal has minimal effect on said main oscillator when said main oscillator has reached said stable condition;

compare and control circuitry including digital logic and frequency detectors, said compare and control circuitry being coupled to said main oscillator and to said tunable oscillator, said compare and control circuitry providing enable signals to said main oscillator and said tunable oscillator, said compare and control circuitry measuring and comparing said output frequency and said tunable frequency, said compare and control circuitry adjusting said tunable frequency until said tunable frequency of said input signal is adjusted so as to be substantially equal to said resonant frequency of said resonator.

2. The oscillator circuit of claim 1, wherein said main oscillator is selected from at least one of a Pierce oscillator, a Colpitts oscillator and a ring oscillator.

3. The oscillator circuit of claim 1, wherein said tunable oscillator is at least one of operating condition independent and operating condition compensated.

4. The tunable oscillator of claim 3, wherein said operating condition is temperature.

5. The oscillator circuit of claim 1, wherein said tunable oscillator is selected from at least one of a ring oscillator, a relaxation oscillator, and an RC oscillator.

6. The oscillator circuit of claim 1, wherein said input signal is a repetitive electronic signal including at least one of a sine wave, a square wave, and a saw tooth wave.

7. The oscillator circuit of claim 1, wherein said tunable frequency is determined from a frequency value control state of said compare and control circuitry; wherein said compare and control circuitry provides said frequency value control state to said tunable oscillator; and wherein said adjusting of said tunable frequency is actuated by adjusting said frequency value control state.

8. The oscillator circuit of claim 1, wherein said main oscillator is in a differential mode.

9. The oscillator circuit of claim 1, wherein said resonant frequency is one of multiple resonant frequencies of said resonator.

10. The oscillator circuit of claim 1, wherein said resonator is at least one of a piezoelectric crystal, a MEMS element, a film bulk element, and a membrane related element.

11. The oscillator circuit of claim 1, wherein said compare and control circuitry can disable said coupling in of said input signal independently of said tunable oscillator.

12. The oscillator circuit of claim 1, wherein said compare and control circuitry disables said tunable oscillator after at least one of a set amount of time, after said compare and control circuitry counts a certain number of pulses from said tunable oscillator or said main oscillator, and after said compare and control circuitry detects when a signal in said oscillator circuit has a selected amplitude.

13. An oscillator circuit, comprising:

A main oscillator generating an output frequency, said main oscillator including a resonator having a resonant frequency;

a tunable oscillator being AC coupled to said main oscillator and providing an input signal to said main oscillator, said input signal having a tunable frequency;

a capacitor coupled to said main oscillator and to said tunable oscillator, said capacitor coupling in said input signal to said main oscillator so that said resonator receives energy at said resonant frequency while said input signal has minimal effect on said main oscillator when said main oscillator has reached said stable condition;

compare and control circuitry being coupled to said main oscillator and to said tunable oscillator, said compare and control circuitry capable of adjusting said tunable frequency until said tunable frequency is substantially equal to said resonant frequency.

14. A method for starting an oscillator quickly, said oscillator having a resonator with a resonant frequency, comprising the steps of:

generating and applying a first impetus signal to said oscillator;

disabling said impetus signal after a first set amount of time;

waiting a second set amount of time so that said oscillator has time to reach a regular operating state;

measuring the frequency of said oscillator in said regular operating state, said frequency being substantially equal to said resonant frequency of said resonator;

tuning a tunable oscillator by adjusting a tunable frequency value control to a specific state so that said tunable oscillator has an output frequency substantially equal to said resonant frequency;

storing said specific state;

holding until said oscillator receives a startup signal;

applying said specific state to said tunable frequency value control; and

AC coupling said output frequency of said tunable oscillator to said resonator of said oscillator;

wherein said tunable oscillator provides said oscillator with a targeted impetus signal for a quick startup time.

15. The method of claim 14, wherein said applying said specific state and said AC coupling are repeated when said oscillator goes through a shutdown and startup cycle.

16. The method of claim 14, wherein said first impetus signal is equal to an estimate of said resonant frequency of said resonator.

17. The method of claim 14, wherein said AC coupling of said output frequency is deactivated after a third set time; and wherein said third set time is substantially shorter than said first set time.

18. The method of claim 14, wherein said generating of said first impetus signal is accomplished by applying an estimate resonant frequency value state to said tunable oscillator; and wherein said estimate resonant frequency value state is chosen to induce said output of said tunable oscillator to be equivalent to an estimate of said resonant frequency.

19. The method of claim 18, wherein said estimate resonant frequency value state is replaced by an earlier stored specific state; wherein said storing of said specific state is done at the same time as storing a corresponding value that relates to a set of operating conditions of said oscillator when said measuring is executed, said specific state and said corresponding value forming an entry in an index of specific states; and wherein said earlier stored specific state is selected from said index of specific states based on which said entry has said corresponding value whose said set of operating conditions most closely match the current operating conditions of said oscillator.

20. The method of claim 18, wherein said estimate resonant frequency value state is replaced by an earlier stored specific state; wherein said storing of said specific state is done at the same time as storing a corresponding value that relates to a particular resonant frequency targeted, said specific state and said corresponding value forming an entry in an index of specific states; and wherein said earlier stored specific state is selected from said index of specific states based on which said entry has said corresponding value whose said particular resonant frequency targeted is equivalent to the currently targeted resonant frequency of said oscillator.

* * * * *